(12) United States Patent
Singh

(10) Patent No.: US 8,835,752 B2
(45) Date of Patent: Sep. 16, 2014

(54) SOLAR CELLS AND METHOD OF MAKING SOLAR CELLS

(75) Inventor: Pritpal Singh, Media, PA (US)

(73) Assignee: Villanova University, Villanova, PA (US)

( * ) Notice: Subject to any disclaimer, the term of this patent is extended or adjusted under 35 U.S.C. 154(b) by 978 days.

(21) Appl. No.: 12/991,578

(22) PCT Filed: May 11, 2009

(86) PCT No.: PCT/US2009/043449
§ 371 (c)(1),
(2), (4) Date: Jan. 26, 2011

(87) PCT Pub. No.: WO2009/140196
PCT Pub. Date: Nov. 19, 2009

(65) Prior Publication Data
US 2011/0155207 A1    Jun. 30, 2011

Related U.S. Application Data

(60) Provisional application No. 61/052,298, filed on May 12, 2008.

(51) Int. Cl.
| | |
|---|---|
| H01L 31/0256 | (2006.01) |
| H01L 21/02 | (2006.01) |
| H01L 31/0725 | (2012.01) |
| H01L 31/0352 | (2006.01) |
| B82Y 20/00 | (2011.01) |
| H01L 31/073 | (2012.01) |
| H01L 31/18 | (2006.01) |

(52) U.S. Cl.
CPC .. *H01L 31/035236* (2013.01); *H01L 21/02628* (2013.01); *H01L 31/0725* (2013.01); *H01L 21/02557* (2013.01); *H01L 21/02568* (2013.01); *B82Y 20/00* (2013.01); *H01L 21/02562* (2013.01); *Y02E 10/544* (2013.01); *H01L 31/073* (2013.01); *H01L 31/1836* (2013.01)
USPC ............ 136/255; 136/252; 136/260; 136/264

(58) Field of Classification Search
USPC .................................. 136/260, 264, 252, 255
See application file for complete search history.

(56) References Cited

U.S. PATENT DOCUMENTS

| | | | |
|---|---|---|---|
| 4,607,272 A | * | 8/1986 | Osbourn ........................ 257/18 |
| 4,688,068 A | | 8/1987 | Chaffin et al. |

(Continued)

FOREIGN PATENT DOCUMENTS

| | | |
|---|---|---|
| CN | 1855552 A | 11/2006 |
| CN | 1910759 A | 2/2007 |
| WO | WO2007034228 A2 | 3/2007 |

OTHER PUBLICATIONS

Supplementary European Search Report dated Oct. 10, 2012 from corresponding EP application No. 09747280.7.

(Continued)

*Primary Examiner* — Jonathan Johnson
*Assistant Examiner* — Christina Chern
(74) *Attorney, Agent, or Firm* — Duane Morris LLP

(57) ABSTRACT

A multi-junction photovoltaic cell includes at least two P-N junctions electrically connected to each other in series. Each P-N junction includes a P-type absorber layer and a N-type emitter layer, each P-type absorber layer including a plurality of alternating thin film layers of zinc telluride and lead telluride, wherein zinc telluride and lead telluride have respective bandgaps when in bulk thickness and the effective bandgap of each P-type absorber layer is between the respective bandgaps. The effective bandgap of at least one P-type absorber layer is different from that of at least one other P-type absorber layer.

20 Claims, 4 Drawing Sheets

(56) References Cited

U.S. PATENT DOCUMENTS

| | | | |
|---|---|---|---|
| 4,950,615 | A | 8/1990 | Basol et al. |
| 2004/0012031 | A1* | 1/2004 | Kishino et al. ............... 257/103 |
| 2005/0155641 | A1 | 7/2005 | Fafard |
| 2006/0207647 | A1 | 9/2006 | Tsakalakos et al. |
| 2008/0092946 | A1 | 4/2008 | Munteanu et al. |
| 2008/0108171 | A1 | 5/2008 | Rogers et al. |

OTHER PUBLICATIONS

Office Action issued Sep. 4, 2012 in corresponding Chinese patent application No. 200980127147.4.

International Search Report and Written Opinion dated Aug. 5, 2009 in corresponding International Application No. PCT/US2009/043449.

Anup Mondal, Robert W. Birkmire, Brian E. McCandless, A New Method for Forming ZnTe Contacts for CdTe Cells, Procs. 22nd. IEEE Photovoltaic Specialists Conf. (Las Vegas, NV) Oct. 7-11, 1991 vol. II pp. 1126-1129 (1991).

T.D. Golden, R.P. Rafaelle, J.A. Switzer, "Cross-sectional scanning tunneling microscopy of electrodeposited metal oxide superlattices", Applied Physics Letters, 63 (11) Sep. 13, 1993, pp. 1501-1503.

R. Vaidyanathan, S.M. Cox, U. Happek, D. Banga, M.K. Malhe, and J.L. Stickney, "Preliminary Studies in the Electrodeposition of PbSe/PbTe Superlattice Thin Films via Electrochemical Atomic Layer Deposition (ALD)," Langmuir 22 (25) pp. 10590-10595 (2006).

B.H. Flowers, Jr., T.L. Wade, J.W. Garvey, M. Lay, U. Happek, and J.L. Stickney, "Atomic Layer Epitaxy of CdTe using an automated electrochemical thin-layer flow deposition reactor," J. Electroanalytical Chemistry 524-525 pp. 273-285 (2002).

Martin A. Green, "Third generation photovoltaics: solar cells for 2020 and beyond," Elsevier Science B.V., Physica E 14 (2002) pp. 65-70.

Madhivanan Muthuvel, and John L. Stickney, CdTe Electrodeposition on InP(100) via Electrochemical Atomic Layer Epitaxy (EC-ALE): Studies Using UHV-EC, Langmuir, 2006, 22 (12), 5504-5508 • DOI: 10.1021/la053353q, Downloaded from http://pubs.acs.org on Feb. 3, 2009.

A.S. Brown, M.A. Green, "Detailed balance limit for the series constrained two terminal tandem solar cells," Elsevier Science B.V., Physica E 14 (2002) pp. 96-100.

Chang Wei and Krishnan Rajeshwar, "Flow Electrosyntheses of Group II-VI Compound Semiconductor Thin Films and Composition-modulated Superstructures," J. Electrochem. Soc., vol. 139, No. 4, Apr. 1992, @ The Electrochemical Society, Inc., pp. L40-L41.

L. M. Goldman, C. A. Ross, W. Ohashi, D. Wu, and F. Spaepen, "New dual-bath technique for electrodeposition of short repeat length multilayers," © 1989 American Institute of Physics, Appl. Phys. Lett. 55 (21), Nov. 20, 1989, pp. 2182-2184.

R. J. Chaffin, G. C. Osbourn, L. R. Dawson and R. M. Biefeld, "Strained superlattice. Quantum well, multijunction photovoltaic cell," CH2019-8/84/0000-0743 © 1984 IEEE, pp. 743-746.

Feng Xiao, Bongyou Yoo, Margaret A. Ryan, Kyu-Hwan Lee, Nosang V. Myung, "Electrodeposition of PbTe thing films from acidic nitrate baths", Science Direct, Electrochimica Acta 52 (2006) 1101-1107.

Amal Kabalan, Amanda Delcore, Haig Norian, and Pritpal Singh, "Electrodeposition and Characterization of Very Thin Film II-VI Compounds for Novel Superlattice Solar Cells," 33rd IEEE Photovoltaic Specialists Conference—May 11-16, 2008.

* cited by examiner

SOLAR CELLS AND METHOD OF MAKING SOLAR CELLS

CROSS-REFERENCE TO RELATED APPLICATIONS

This application claims priority to U.S. Provisional Patent Application No. 61/052,298, entitled "Electrodeposition and Characterization of Very Thin Film II-VI Compounds for Novel Superlattice Solar Cells," filed May 12, 2008, the entirety of which is hereby incorporated by reference herein.

FIELD OF THE INVENTION

The present invention relates to thin film solar cells and to solar cells utilizing superlattice structures.

BACKGROUND OF THE INVENTION

Solar cells are devices that convert solar energy into electrical energy by releasing electric charges that can move in the semiconductor and ultimately flow through an electric load. The phenomenon of producing current in this way is called the photovoltaic effect. Photovoltaic systems are designed around photovoltaic cells. Since a typical photovoltaic cell produces less than 3 watts at approximately 0.5 volt DC, cells must be connected in series-parallel configurations to produce enough power for high-power applications. Arrays of photovoltaic cells form a photovoltaic module, also known as a solar module.

A trend in recent years has been to explore the use of quantum well and quantum dot structures for more effective bandgap tuning and transport control. The advantage of using multi-quantum well structures, for example, in a solar cell is that the effective bandgap can be tuned by varying the thickness of the material layers rather than by changing the composition of the material (a more difficult parameter to control). U.S. Pat. No. 4,688,068 to Chaffin et al., the entirety of which is hereby incorporated by reference herein, describes the general structure of a multi-quantum well solar cell and describes specific applications using III-V compounds. Quantum well structures of this type are typically grown by molecular beam epitaxy (MBE) or metalorganic chemical vapor deposition (MOCVD). These techniques tend to be expensive and involve the use of very toxic chemicals, at least in the case of MOCVD.

Improved thin film and quantum well structures for solar cells and methods of forming solar cells are desired.

SUMMARY OF THE INVENTION

A multi-junction photovoltaic cell includes at least two P-N junctions electrically connected to each other in series. Each P-N junction includes a P-type absorber layer and a N-type emitter layer, each P-type absorber layer including a plurality of alternating thin film layers of zinc telluride and lead telluride, wherein zinc telluride and lead telluride have respective bandgaps when in bulk thickness and the effective bandgap of each P-type absorber layer is between the respective bandgaps, The effective bandgap of at least one P-type absorber layer is different from that of at least one other P-type absorber layer.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
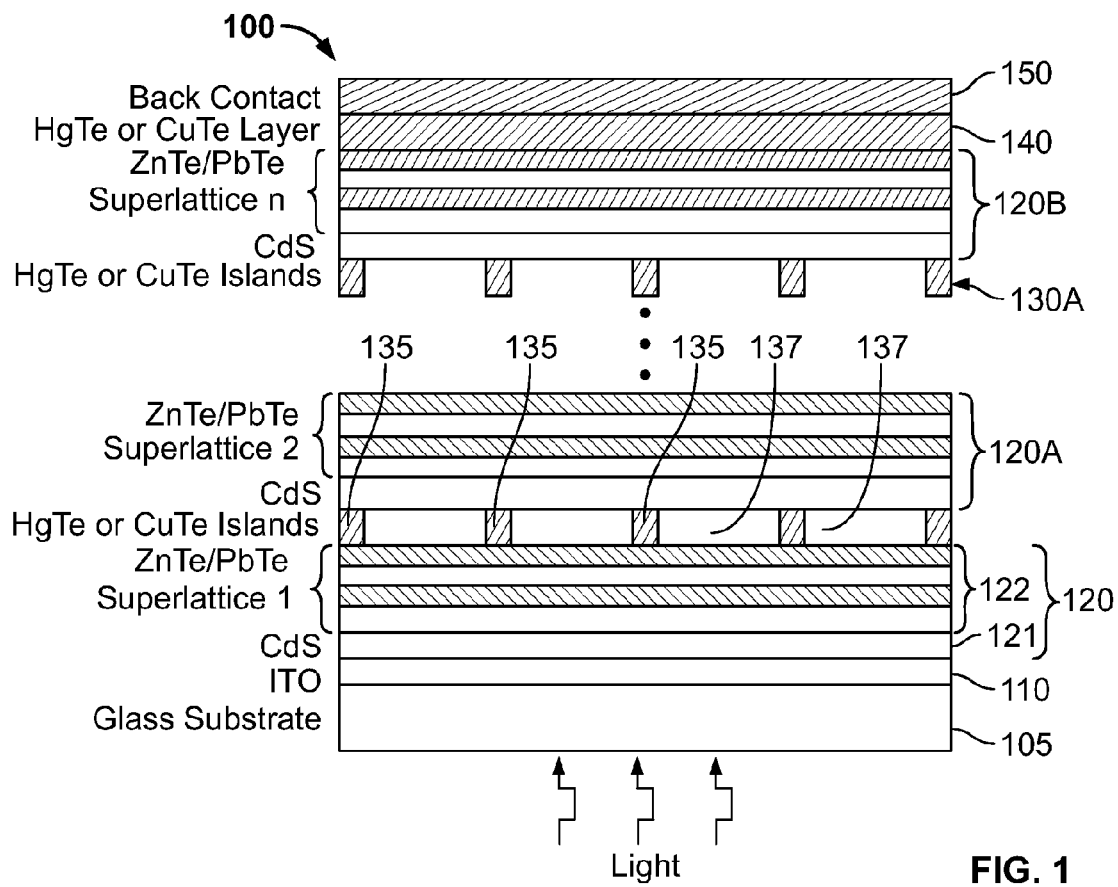
FIG. 1 is a side view of an exemplary embodiment of a multi-junction solar cell according to the present invention.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

As described herein, II/VI and IV/VI (e.g., ZnTe and PbTe) material layers can be electrodeposited in thin film thicknesses, less than bulk thicknesses, that are sufficiently thin so that the effective bandgap of the absorber layer of the resultant P-N junction is between the respective bandgaps of the bulk thickness II/VI and IV/VI materials. In exemplary embodiments, the II/VI and IV/VI layers are ZnTe and PbTe, respectively, although other materials such as ZnSe, ZnS, PbSe and PbS may be appropriate. In some exemplary embodiments, the thickness of the thin film layers is in the order of 100 nm or less such that the alternating layers form a compositional superlattice. One exemplary structure has individual layers of thicknesses in the range of 10-100 nm, with a total thickness for the compositional superlattice in the range of 1-5 μm. Exemplary methods for forming these structures using electrodeposition techniques are also described herein.

Scientists have divided solar cells development into three generations. The first generation photovoltaic solar cells are formed on silicon wafers or use polysilicon. The second generation of photovoltaic materials is based on the use of thin-film deposits of semiconductors. Regardless of semiconductor, thin films offer prospects for a major reduction in material costs by eliminating the silicon wafer utilized in first generation solar cells. Thin films also offer other advantages, particularly increases in the unit of manufacturing from a silicon wafer (~100 cm$^2$) to a glass sheet (~1 m$^2$), which is about 100 times larger. In terms of energy conversion efficiency, this second-generation technology with time should largely bridge the present gap between itself and first generation products. To progress further, conversion efficiency needs to be increased substantially. The Carnot limit on the conversion of sunlight to electricity is 95% whereas the theoretical upper limit is 33% for a standard single bandgap solar cell. This suggests that the performance of solar cells can be improved 2-3 times if different concepts are used to produce a third generation of high performance, low cost photovoltaic products.

One key source of loss in the first and second-generation solar cells is when the photo-excited pair quickly loses energy in excess of the band gap. A low-energy red photon is just as effective as a much higher energy blue photon. Balancing this loss with the loss of low-energy photons passing straight through the device alone limits conversion efficiency of a single bandgap cell to about 44%.

Another important loss process is due to recombination of the photo-excited electron-hole pairs. This loss can be kept to a minimum by using materials with long minority carrier lifetimes for photo-generated carriers. The tandem cell concept, where multiple cells are used each with different bandgaps and each converting a narrow range of photon energies close to its bandgap, can address these recombination losses. Other losses include junction and contact voltage losses.

Third generation solar cells aim at reducing the above-described losses by manufacturing different solar cell structures. Losses due to recombination of photo-excited electron-hole pairs can be largely eliminated if the energy of the absorbed photon is just a little higher than the cell bandgap.

An approach in third generation solar cells that allows the variation of a material's bandgap without varying the composition of the material is a superlattice structure where two materials of variable thickness are grown. In a multi-quantum well structure (also known as a compositional superlattice) alternating layers of two materials of thicknesses sufficiently small to invoke quantum effects (about a few hundred Å) are grown. When a superlattice of two dissimilar semiconductors A and B of bandgaps $Eg_1$ and $Eg_2$ is fabricated, the overlap and interaction of the electron and hole wavefunctions between the quantum wells established by the modulation of the conduction and valence band edges results in the formation of either a type I or a type II superlattice depending on the conduction and valence band offsets. If the valence band and conduction band offsets of the smaller bandgap material are fully contained within the larger bandgap material (type I superlattice) mini-bands are formed in the quantum wells. The positions of these mini-bands can be determined by solving the Kronig-Penney model (to a first approximation) for each individual band, assuming values for the effective masses of the charge carriers. The photon absorption occurs between the occupied mini-bands in the valence band and the unoccupied mini-bands in the conduction band. It can be said, therefore, that the periodic alternation of layers gives rise to a periodic alternation in electric potential. Specifically, each layer of the semiconductor with the smaller band gap produces a potential well. Inside each potential well only certain energy states are available to conduction-band electrons. Each state is split into a quasi-continuum or miniband. As the relative thickness of the A and B layers is adjusted, the positions of these mini-bands change resulting in a different effective bandgap. The range over which the effective bandgap can be changed is governed by the bandgaps of the constituent semiconductors A and B and does not require any compositional change to the semiconductors. Since it is so hard to control precisely the composition of alloy semiconductors, this approach is very powerful since it only requires control of the composition of compound semiconductors and their thicknesses, a relatively easier task.

In typical practice, the semiconductor with the smaller bandgap can be a material such as gallium arsenide (GaAs) and the one with the larger band gap can be aluminium gallium arsenide (AlGaAs). Calculations for a compositional superlattice consisting of layers of such materials show that the minibands are much narrower than the bands in any bulk semiconductor and also that the minibands are separated from each other in the conduction band by relatively large minigaps. The only requirement is that the thickness of the two types of layers be less than about 100 nm, and most preferably in the range from four to 10 nm where quantum effects become most pronounced.

Quantum well structures (such as GaAs/AlGaAs structures) are typically grown by molecular beam epitaxy (MBE) or metalorganic chemical vapor deposition (MOCVD). These techniques tend to be expensive and involve the use of very toxic chemicals in the case of MOCVD. These disadvantages can be overcome by fabricating thin film or quantum well structures by the low cost electrodeposition method. More specifically, one base solar cell absorber structure embodiment proposed herein comprises alternating layers of zinc telluride (ZnTe) and lead telluride (PbTe) deposited by electrodeposition. To date, this type of ZnTe/PbTe superlattice for solar cells has not been implemented. A type I ZnTe/PbTe superlattice can be formed either through as-deposited films or through inducing strain in the layers through appropriate changes in the material deposition parameters (and layer thicknesses), as discussed herein.

In bulk form, ZnTe has a bandgap of 2.4 eV, while PbTe has a bandgap of 0.29 eV. By changing the relative thicknesses of the ZnTe and PbTe, type I superlattices with bandgaps covering the desirable wavelength range of 0.5 µm to 4.0 µm can be fabricated (although the optical spectrum of interest lies in the wavelength range of 0.4-2.0 µm). One embodiment of a solar cell structure is shown in FIG. 1. As described in more detail below, the structure is a multijunction solar cell comprising thin films of ZnTe/PbTe as the absorber layer or ultrathin films forming ZnTe/PbTe superlattices as the absorber layer. The effective bandgaps of these thin film or superlattice stacks are adjusted by varying the relative thicknesses of the ZnTe and PbTe layers. ZnTe is a p-type semiconductor and PbTe can be p-type or either n-type depending on its doping.

In certain embodiments, a layer of n-type CdS serves as the emitter for this solar cell structure, although alternative materials such as ZnO may also be appropriate for the emitter layer. With specific reference to FIG. 1, in one exemplary embodiment, the proposed structure comprises a set of superlattice heterojunction solar cells of different effective bandgaps connected in a series configuration. The solar cell module 100 includes a glass substrate 105. A conductive bottom contact layer 110 is formed on the glass substrate 105. In exemplary embodiments, the conductive bottom contact layer 110 is a layer of indium tin oxide (ITO). The solar cell module includes a first P-N junction 120 disposed over the substrate 105. The first P—N junction includes an n-type emitter layer 121, such as a layer of CdS. The P-type absorber layer 122 of the P-N junction 120 preferably includes a superlattice structure, which comprises alternating layers of very thin II-VI and IV-VI layers. Preferably, the absorber layer 122 is formed from alternating layers of ZnTe and PbTe. In certain embodiments, the layers are thin film that, while still exhibiting an effective bandgap between the respective bandgaps of the bulk thickness materials, are not of superlattice thickness (i.e., are not thin enough to exhibit quantum effects).

It should be understood that the current collected by each P-N junction can be controlled by varying the thickness of the absorber layer 122 and/or the number of layers of a given thickness that form the absorber layer 122. Assuming that each layer in the superlattice structure is approximately 300 Å thick, an effective absorption thickness of about 1 μm would require approximately 30 layers.

The solar cell module includes at least one second P-N junction, such as P-N junction 120A. P-N junction 120A, like P-N junction 120, includes an N-type CdS emitter layer and a p-type absorber layer formed from a ZnTe/PbTe superlattice. An interconnect layer 130 electrically connects the first P-N junction 120 to the second P-N junction 120A. In one embodiment, the interconnect layer includes conductive islands 135, such as HgTe or CuTe islands, for making the electrical interconnection. These islands can be formed in a grid layout, leaving transparent areas 137 (i.e., areas of wide bandgaps) therebetween for passing the incident light to the P-N junction(s). In an alternative embodiment, a conductive continuous semi-metallic film layer (e.g., HgTe or CuTe) is formed but is sufficiently thin such that is it not opaque, i.e., such that is allows for the passing of the incident light. In embodiments, the islands 135 are formed by a lithography/etching process familiar to those in the art. A translucent material such as a $ZnO_x$ or $SiO_x$ can be used to fill the voids 137. If a mechanical connection is to be made between layers, a transparent epoxy can be used in voids 137. In yet other embodiments, a conductive transparent layer such as ITO may be used. Tunnel junctions, such as those described in Chaffin et al. may also be appropriate in certain embodiments.

As shown in FIG. 1, the solar cell structure can include "n" number of P-N junctions described above connected in series. The topmost P-N junction is labeled in FIG. 1 as "120B" and is connected to a P-N junction immediately below by interconnect layer 130A. A thin conductive layer 140, such as a layer of HgTe or CuTe, is formed over the final P-N junction and is used to make good contact with a back contact between the backmost absorber layer and layer 150. In embodiments, back contact layer 150 is a thicker layer of HgTe or CuTe or graphite paste.

One significant advantage of a multi-junction solar cell as shown in FIG. 1 is that the resultant spectrum of P-N junction bandgaps can be tailored to fit the incident light spectrum, e.g., the solar spectrum. The effective bandgaps of these superlattices of FIG. 1 are adjusted by varying the relative thicknesses of the ZnTe and PbTe layers. Assuming the solar cell structure 100 is a two-cell tandem solar cell, the optimal bandgaps for a two-cell tandem solar cell are 1.0 and 1.8 eV. In this embodiment, the first P-N junction 120 (i.e., that junction closest to the glass substrate 105 and the first P-N junction to be exposed to the light source) would be designed to have the wider bandgap of 1.8 eV and the second P-N junction would be designed to have the narrower bandgap of 1.0 eV. For a three-cell tandem cell structure, the optimal bandgaps are 0.8 eV, 1.4 eV and 2.3 eV. Notwithstanding the foregoing description, it should be understood that the number of p-n junctions that can be included in a solar cell of this invention is essentially unlimited and can be quite large in order to improve the efficiency of the solar cell by matching the different bandgaps to the solar spectrum. In embodiments, the number of P-N junctions and their respective bandgaps can be selected such that essentially all of the impinging solar radiation in the U.V. through near infrared range will be absorbed.

In alternative embodiments, rather than form a stacked structure as shown in FIG. 1, a four-(or more) terminal configuration can be utilized wherein each cell is formed over its own glass substrate and designed to have a respective bandgap. In one example, two individual cells of different bandgaps are strung together in a four-terminal configuration so that cell-to-cell matching and interfacing between the cells is not an issue.

The approach used for growing the films of the above-described P-N junctions is a combination of chemical bath deposition for the CdS emitter layer and electrodeposition for the ZnTe and PbTe layers. Both of these techniques are low-cost methods. Chemical bath deposition is a well-established technique for the growth of high quality very thin films (approximately 1,000 Å) of CdS. To date no known work has been performed on using electrodeposited thin film or quantum well structures to prepare and optimize solar cell device structures. An important issue for electrodeposition in the past has been scaling of the technique to large areas because of the voltage drop across the surface of the substrate and the critical dependence of the alloy composition on the electroplating potential. This is where the multi-quantum well structure offers a significant advantage in that compounds are used to tune the bandgap of the device rather than ternary alloys of the constituent elements. The composition of compounds can be kept constant and this assures reproducibility of film properties.

In electrodepositing the various films discussed herein, a bath containing ions of the constituent metals to be deposited, dissolved in solution, is prepared. For example in the case of depositing ZnTe, $Zn^{2+}$ and $HTeO_2^+$ ions are dissolved in solution. The working electrode comprises a conducting substrate upon which the thin film is to be deposited. A potentiostat/galvanostat can used to apply the desired bias between the working electrode and a counter electrode.

The ions, which dissolve in the bath, depend on the pH of the electrolyte. Pourbaix developed a set of phase diagrams that provide this information for different aqueous electrochemical systems. Given the ions in solution, the applied potential, E, required to deposit particular ions is governed by the Nernst equation:

$$E = E^0 - \frac{RT}{nF} \ln\left(\frac{a_{ox}}{a_{red}}\right) \quad (1)$$

where $E^0$ is a standard reference potential, R is the universal gas constant (8.314510 J $K^{-1}$ $mol^{-1}$), T is the absolute temperature, n is the number of electrons transferred in the half-cell reaction, F is the Faraday constant (9.6485309*$10^4$ C $mol^{-1}$) and $a_{ox}$ and $a_{red}$ are the activities of the oxidizing and reducing species in the bath. The activities of the species in the bath, to first order, are equal to the concentrations of the species in the bath. The variables in the bath that can be used to control the composition of the films are bath temperature, bath pH, stirring rate, and concentrations of the ions in the bath. The deposition current and the applied voltage can also be used to control the composition of the films. The quality of the films can also be improved by using very small concentrations of surfactants.

PbTe and ZnTe films can be electrodeposited from acidic baths at a similar pH of approximately 3 or less. Contacts to ZnTe that have ohmic behavior include $Cu_2Te$ and HgTe, both of which can be electrodeposited.

The electrodeposition of superlattices can be achieved in one of two different ways. In the first way, the substrate is switched between baths to grow the individual layers. The second approach uses a flowing electrolyte that is switched between deposition layers. The latter approach has been developed to the point where single atomic layers of the individual elements of compound semiconductors may be grown by employing surface limited reactions. The morphology of the deposit can be better controlled in the latter approach and is the preferred technique for the growth of superlattice structures disclosed herein.

Another important consideration in film growth for solar cell applications is grain size in microcrystalline films. It is believed that post-formation heat treatments can be used to optimize cell performance. The thin CdS emitter layer should be heat treated in air with or without a $CdCl_2$ treatment to promote larger grain size. This will help to promote larger grain PbTe and ZnTe films to form on the CdS layer, although further post-deposition heat treatment may also be required. Large grain size is desired to maximize collection efficiency of the photogenerated carriers.

Several experiments were performed to ensure the viability of electrodepositing PbTe/ZnTe thin film and superlattice structures for forming the p-type absorber layer of the P-N junction of the solar cell 100 shown in FIG. 1. These experiments are described below. These experiments involved close and accurate tracking of five major parameters that affect the film deposition. The first parameter is the concentration of the chemicals. These concentrations were calculated using the basic molarity formula. Then the masses were measured using a sensitive scale. The second parameter that was monitored was the temperature. Temperature plays a significant role in the rate of the chemical change and thus the rate of film deposition.

Temperature was measured using a thermometer. The third parameter is the pH, which was monitored using a pH meter. The last two parameters were the deposition current and the applied voltage.

The thin films were deposited on a glass substrates coated with indium tin oxide (ITO) glass. Substrates of this type are available from the PPG Industries of Pittsburgh, Pa. The sheet of glass used had a 1 ft$^2$ (12"×12") area and a thickness of approximately 0.5 cm. The properties of the glass are shown in Table 1.0 below. The large sheet was then cut into smaller 1.5"×1" slides. The resistance of the small slides was around 25 Ω.

TABLE 1.0

Properties of the glass substrate

| Shading Coefficient | Visible Light | Winter U-Value | Summer U-Value |
|---|---|---|---|
| 0.71 | 74% | 0.35 | 0.35 |

The small glass substrates were dirty due to the various treatments that they had undergone. The presence of dust, oils from handling, and minor scratches can negatively affect the thin film deposition. A scratch, for instance, may cause buckling of the film. Dirt or oil may cause poor adhesion between the deposited film and the glass substrate. Therefore, prior to deposition, each substrate was cleaned as described below:

The substrate was placed in an ultrasonic bath in 2% Micro 8790 detergent solution for twenty minutes. The Micro 8790 detergent solution recommends 75 ml of detergent for every gallon of water. Thus, the bath included approximately 2 ml detergent for 100 ml deionized water.

The substrate was then placed in an ultrasonic bath of de-ionized water rinse for 20 minutes, followed by a 5 minutes acetone bath and a 5 minute methanol bath. The substrate was then blow dried with $N_2$ gas. To ensure the utmost cleanliness of the slides, water was dropped onto the slide. The formation of droplets indicates the presence of dirt/oil and thus an insufficiently cleaned substrate. However, if the water cascades freely off the slide, cleanliness is ensured.

After cleaning the substrate, it was placed in a bath apparatus for chemical deposition of the CdS film. As noted above, pH is one of the important parameters that controls the deposition of the films and thus should be monitored accurately and closely. A calibrated, highly reliable pH meter was used to monitor pH of the bath.

CdS Chemical Bath Deposition:

Cadmium Sulfide was deposited on the ITO-coated glass substrate using chemical bath deposition. This process is dependent upon the careful mixing of certain chemical reactants and their interaction with a glass surface. It is important to control the rate of these reactions so that they occur slowly enough to allow the CdS to form gradually on the substrate or to diffuse and adhere either to the substrate itself or to the growing film, rather than aggregate into larger particles in solution and precipitate out. This rate can be controlled by the temperature, pH and/or the concentration of sulfide forming precursors in the bath.

When the cadmium acetate is first added into the solution, it will dissolve into $Cd^{+2}$. The $Cd^{+2}$ will react with $OH^-$ ions and precipitate (equation (2)). To prevent this precipitation, ammonia is added. Ammonia will react with $Cd^{+2}$ as shown in equation (3) and prevents its precipitation into $Cd(OH)_2$. The $OH^-$ will then react with thiourea instead and release the sulfur ions in the solution (equation (4)). As the reaction progresses the ammonia will release the $Cd^{+2}$ ions (equation (5)), which will react with the $S^{2-}$ ions available in the solution (equation (6)).

$$Cd^{+2}+2OH^-\rightarrow Cd(OH)_2 \quad (2)$$

$$Cd^{+2}+4NH_3\rightarrow Cd(NH_3)_4^{2+} \quad (3)$$

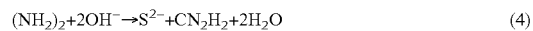

$$(NH_2)_2+2OH^-\rightarrow S^{2-}+CN_2H_2+2H_2O \quad (4)$$

$$Cd(NH_3)_4^{2+}\rightarrow Cd^{+2}+4NH_3 \quad (5)$$

$$Cd_{+2}+S^{2-}\rightarrow CdS \quad (6)$$

The precise mechanics of the CdS chemical deposition are not known. The most probable mechanism of the film deposition is believed to be ion-by-ion growth. This model requires super saturation of the ions to be deposited. In the presence of an added surface, in this case the ITO-coated glass substrate, the subsequent addition of heterogeneity was observed that in turn assists nucleation. The most important molecular force in this deposition is the Van der Waals, which is strong enough to ensure adhesion of the CdS crystals to one another. Once nucleation has begun, the process reaches its optimum deposition state. In other words, it is much easier for semiconductor crystals to form atop other similar crystals rather than on a clean surface. However, the reaction is believed to be more involved than the simple ion-by-ion mechanism as the intermediate reactants are not simply the metal ions.

Several experiments were performed to determine the deposition parameters for depositing the desired layer of CdS on the ITO-coated substrate. A bath of deionized water was prepared and heated. Then, cadmium acetate, ammonium acetate, thiourea and ammonia were added to the bath. The magnetic stirrer was turned on. The pH was adjusted by slowly adding drops of NaOH. Ammonia was added to regulate the pH of the solution when it decreased as the experiment progressed. Deionized water was added to bring the volume of the bath back to levels as it decreased because of evaporation. The temperature of the experiments was kept almost constant by adjusting the heat as needed during the experiment. Having a constant temperature allowed the pH to fluctuate only minimally and thus the solution was very homogeneous.

The parameters listed below in table 2.0 are a summary of the deposition parameters that produce a uniform luminous yellow film.

TABLE 2.0

CdS deposition parameters

| Materials/Conditions | Range |
|---|---|
| DI Water Bath | 200 ml |
| Ammonium Acetate | 308 mg |
| Cadmium Acetate | 23 mg |
| NH$_4$OH | 4-6 ml |
| SC(NH$_2$)$_2$ (Thiourea) | 45.6 mg |
| NaOH | 2-4 ml |
| PH | 11 |
| Temp | 70(+/− 2) ° C. |
| Time | 50 minutes |

The composition of a deposited CdS film was analyzed using a scanning electron microscope. It was observed that Cd and S were deposited in equal stoichiometric proportions on the ITO-coated glass substrate. In order to confirm the type of the deposited material, optical characterization tests were also performed. The data obtained showed that the material had a bandgap of 2.41 eV, which is very close to the expected 2.4 eV CdS bandgap.

The order of adding the materials that provided the most stability in the pH and the temperature, and thus was considered the preferred order, was Ammonium Acetate, Cadmium Acetate, Ammonia, Thiourea then Ammonia.

Figure 2:
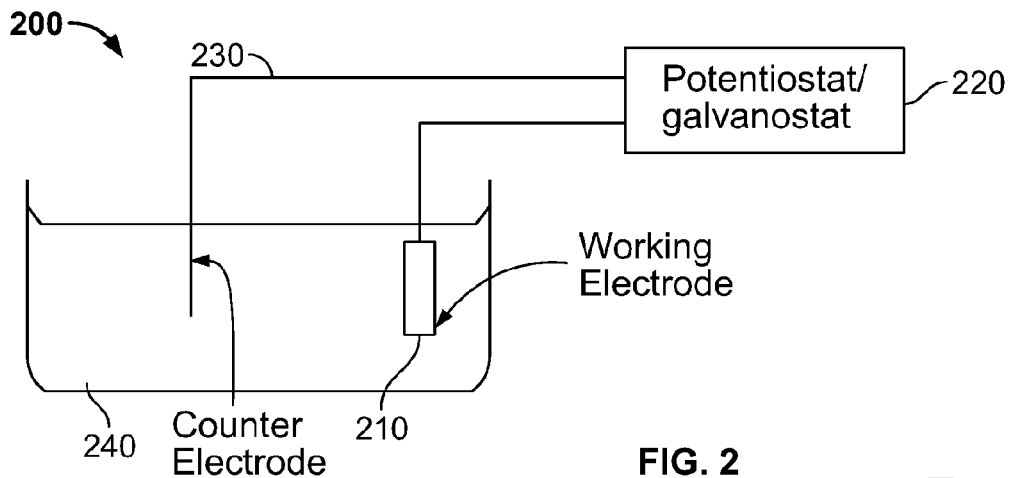
FIG. 2 is a schematic diagram of an electrodeposition apparatus for electrodepositing thin films in the formation of a cell.

ZnTe Electrodeposition:

A schematic diagram of a basic electrodeposition set up 200 used for electrodepositing a ZnTe film is shown in FIG. 2. A bath 240 containing ions of the constituent metals to be deposited, dissolved in solution, was prepared. For example in the case of depositing ZnTe, $Zn^{2+}$ and $HTeO_2^+$ ions were dissolved in solution. The working electrode 210 is the conducting substrate upon which the thin film is to be deposited. In the experiments, the conducting substrate was an indium tin oxide (ITO)-coated glass substrate. A potentiostat/galvanostat 220 was used to apply a bias between the working electrode 210 and a counter electrode 230. The counter electrode 230 was a Zn foil.

As described above, a ZnTe film deposited on the CdS layer in the proposed solar cell structure serves as the first layer of the superlattice of the p-type absorber layer of the P-N junction 120. ZnTe, in bulk form thicknesses, has a bandgap of 2.29 eV. ZnTe can be deposited as a p-type or an n-type film depending on the voltage applied in the electrodeposition process. In the preferred structure shown in FIG. 1, the film is p-type.

The following stoichiometric calculations where used in determining the correct amounts of zinc chloride and tellurium dioxide for use in the process:

Zinc Chloride:

$$\frac{136.3 \text{ g}}{\text{mol}} \cdot \frac{0.1\_\text{mol}}{L} \cdot 0.1 \text{ L} = 1.36 \text{ g}$$

Tellurium Dioxide:

$$\frac{15 \text{ g}}{\text{mol}} \cdot \frac{10^{-3}}{L} \cdot 0.1 \text{ L} = 15.9 \text{ mg}$$

Experiments were performed to determine the electrodeposition parameters for electrodepositing the ZnTe film by cathodic deposition. $TeO_2$ was speciated in NaOH. Also, $ZnCl_2$ was dissolved using deionized water. $TeO_2$ was added to a heated bath of deionized water. The pH was adjusted to the desired level by adding drops of concentrated HCl. $ZnCl_2$ was added slowly to the solution. The deposition method used short circuit electrodeposition where the cathode is connected directly to the anode to facilitate electron transfer. A two electrode cell configuration [wire cathode-solution-anode-wire-glass] was used. The ITO-coated cathode was placed 2 cm away from the zinc foil anode, both submerged in the bath. The zinc foil and the substrate were short circuited by soldering an indium wire on the ITO-glass and secured with Kapton tape. The wire can be either spot welded or attached to the anode with an alligator clip.

Figure 8:
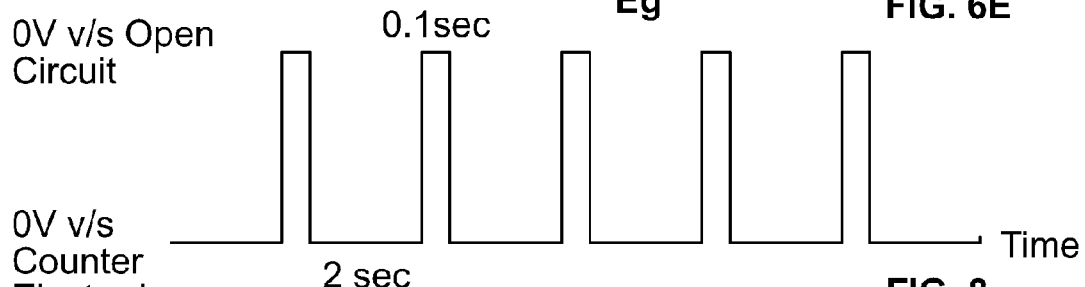
FIG. 8 is a timing diagram of a pulsed voltage used in depositing a ZnTe film.

While experiments were run using direct voltage, pulsed voltages were used to deposit thin films in the thickness ranges from about 0.2-0.4 μm. FIG. 8 is a timing diagram of the pulsed voltage used in the experiment. In FIG. 8, "v/s counter electrode" means that the 0 V is being applied between the counter and the working electrodes. Also, "v/s open circuit" means that the potential on the working electrode will be with respect to the solution/bath, and not the counter electrode. But this voltage is still between the same two electrodes. That is, the pulsed voltage is between the working electrode and the counter electrode, at all times, but its value/amplitude is different. And it is that difference in the applied voltage that is represented, and not any change in the connections. The connection is between the working and counter electrode.

The best results occurred when the film was deposited slowly on the substrate. Table 3.0 shows a summary of the preferred parameters for depositing a ZnTe film of about 0.2-0.4 μm in thickness. The film was initially a light golden/amber color and turned darker with time. The film did not come off when rinsed with water and thus showed good adherence to the glass.

TABLE 3.0

ZnTe Electrodeposition Parameters

| Materials/Conditions | Value |
|---|---|
| DI Water Bath | 100 ml |
| TeO$_2$ (10$^{-3}$ M) | 13 mg |
| ZnCl$_2$ (0.1M) | 1.2 gm |
| HCl (conc) | 0.5-1 ml |
| NaOH | 2-4 ml |
| pH | 1.85-2.2 |
| Temp | 55-60° C. |
| Stirrer | off |
| Time | 15-20 seconds |
| Pulsed Voltage/Current | FIG. 8/1.0-1.2 mA/cm$^2$ |

PbTe Electrodeposition:

As described above, a PbTe film is deposited on the ZnTe layer in the proposed solar cell structure 100 and serves as the second layer of the thin film or superlattice structure of the p-type absorber layer of the P-N junction 120. In bulk form thicknesses, PbTe has a bandgap of 0.29 eV. PbTe can be deposited as a p-type film or an n-type depending on the voltage applied in the experiment. In the structure of FIG. 1, PbTe is deposited as p-type film.

The following stoichiometric calculations where used in determining the correct amounts of zinc chloride and tellurium dioxide for use in the process Lead Nitrate:

$$\frac{207.2 \text{ g}}{\text{mol}} \cdot \frac{0.05\_\text{mol}}{\text{L}} \cdot 0.1 \text{ L} = 1.036 \text{ mg}$$

Tellurium Dioxide:

$$\frac{159 \text{ g}}{\text{mol}} \cdot \frac{0.5 \cdot 10^{-3}}{\text{L}} \cdot 0.1 \text{ L} = 7.95 \text{ mg}$$

Figure 9:
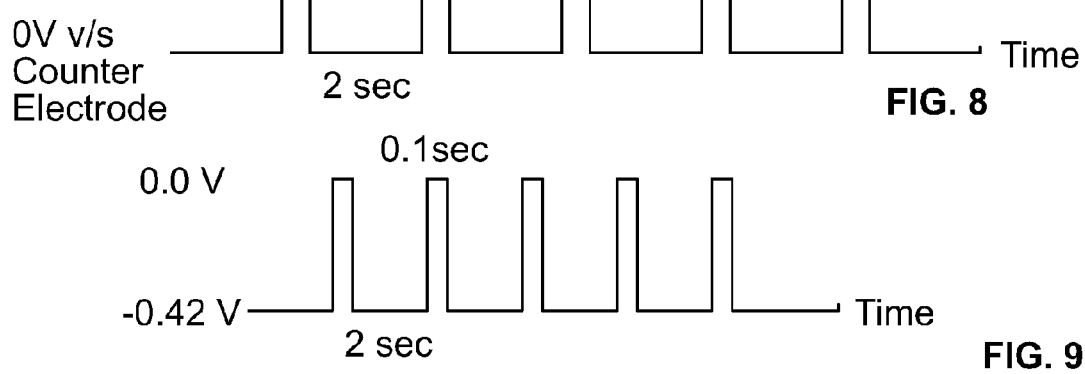
FIG. 9 is a timing diagram of a pulsed voltage used in depositing a PbTe film.

While experiments were run using direct voltage, pulsed voltages were used to deposit thin films in the thickness ranges from about 0.2-0.4 μm. FIG. 9 is a timing diagram of the pulsed voltage used in the experiment. The electrodeposition set up 200 of FIG. 2 was used. The bath 240 containing ions of the constituent metals to be deposited, dissolved in solution, was prepared. The working electrode/cathode 210 upon which the thin film was to be deposited was again an ITO-coated glass substrate. The counter electrode 230 was graphite carbon. A potentiostat/galvanostat 220A was used to apply a bias between the working electrode 210 and a counter electrode 230.

$TeO_2$ was speciated with NaOH and then added to deionized water. $Pb(NO_3)_2$ was dissolved in deionized water. Drops of $HNO_3$ were added to adjust the pH of the solution. Upon addition of the $Pb(NO_3)_2$ to the solution, small white particles were observed and the solution became heterogeneous. The bath was heated. Upon stabilization of the bath, an electrode cell was inserted as shown in FIG. 2, and a pulsed voltage as shown in FIG. 9 was applied. The film deposited immediately and rapidly. The film had a homogeneous growth. Very small holes appeared on the film which disappeared later. The film had good adherence and reflectivity. It was light grey in color. A summary of the parameters that produced the best film are listed in Table 4.0 below.

TABLE 4.0

| PbTe Electrodeposition Parameters | |
|---|---|
| Materials/Conditions | Value |
| DI Water Bath | 100 ml |
| $TeO_2$ (0.01M) | 7 mg |
| $Pb(NO_3)_2$ (0.05 mM) | 1.28 gm |
| $HNO_3$ | 0.5-1 ml |
| NaOH | 2-4 ml |
| pH | 1.85-2.2 |
| Temp | 55-60° C. |
| Stirrer | off |
| Time | 15-20 seconds |
| Pulsed Voltage/Current | FIG. 9/2.0-2.2 mA/cm$^2$ |

Tests confirmed that absorber layers formed using thin film layers of ZnTe/PbTe can have effective bandgaps between the respective bandgaps of bulk thickness ZnTe and PbTe. Surprisingly, this shows that even at thin film (but not yet superlattice thicknesses), the thicknesses of the layers can be used to control the effective bandgap of a stacked structure. Nonetheless, providing films of ZnTe and PbTe in the order of nanometers is required to obtain the quantum well effects. These superlattice structures will afford even greater control of the resultant effective bandgap of the stacked structure as well as more effective absorption of the incident light. One of the parameters that can be used to control the thickness of the thin film deposition is the current. Having a low deposition current causes the film to deposit very slowly. Therefore, by depositing the films for a short time a low thickness can be obtained. The deposition current can be regulated by the pH and the temperature of the bath.

The morphology of these films was analyzed using a scanning electron microscope (SEM). The CdS film was very uniform, indicating that the chemical bath deposition was effective for depositing CdS films. Some NaOH molecule grains were observed. It is believed that annealing the structure under high temperature would eliminate the NaOH residues.

Figure 4:
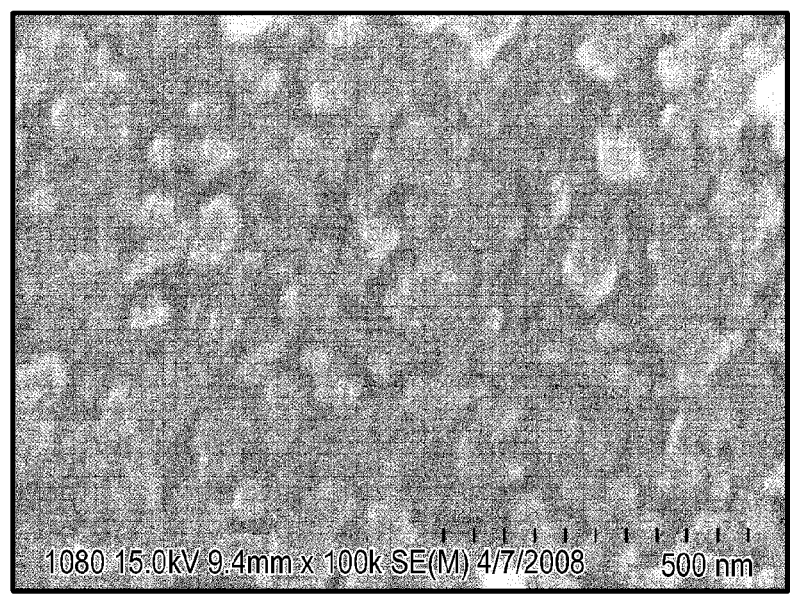
FIG. 4 is a SEM view of an electrodeposited ZnTe film.

The ZnTe film observed under the SEM showed that the film grows in an aggregate fashion where one grain deposits on the substrate and then the other Zn and Te atoms become attached to it until the overall film forms. The images showed white and black particles, which indicates the presence of two types of molecules. A SEM view of this ZnTe film at 100,000× magnification is shown in FIG. 4. The heavy molecules are indicated in black and the light molecules are represented in white. Since the atomic weight of Pb (127) is almost double that of Zn (66), it is believed that Pb is represented in black and Zn is represented in white. The average grain size of the film was determined to be around 120 nm.

Figure 5:
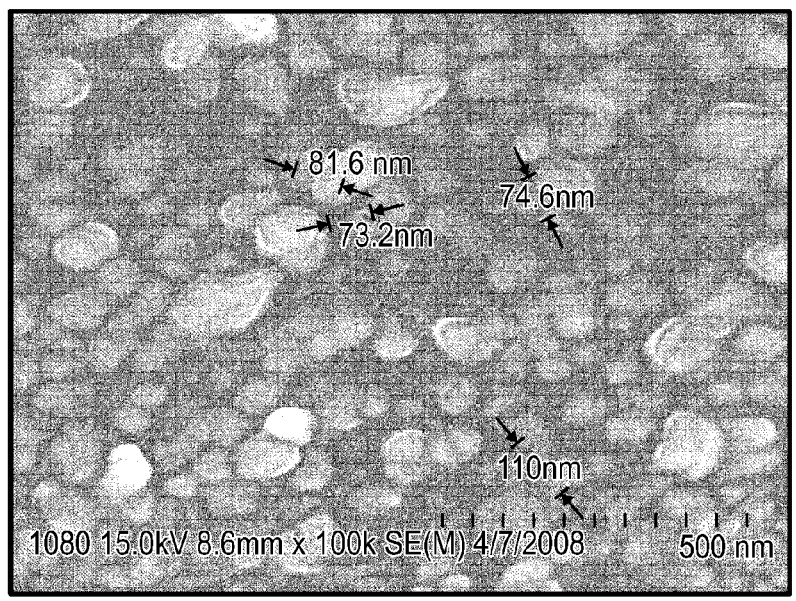
FIG. 5 is a SEM view of an electrodeposited PbTe film.

The PbTe film observed using SEM showed that the electrodeposited film was highly compact. This means that the film is highly uniform. The average grain size of the film was around 100 nm. An SEM view of the PbTe film at 100,000× magnification is shown in FIG. 5.

Energy Dispersive Spectrometry (EDS) is a tool built into the SEM that allows for the identification and characterization of materials by detecting X-ray signals that are emitted from the sample when hit by the electron beam. This tool was used to perform chemical characterization of the CdS, PbTe and ZnTe films.

The EDS measurements showed that the CdS film consisted of 52% by weight of Cd and 48% by weight of S. The calculated atomic percentages of the Cd and S were 56% and 44%, respectively.

The EDS measurements showed that the ZnTe film consisted of 48% by weight Zn and 52% by weight Te. The calculated atomic percentage of Zn was 62% and the atomic percentage of Te was 38%.

Finally, the EDS measurements showed that the PbTe film was 58% by weight of Pb and 42% by weight of Te. The calculated atomic percentage based on these weight percentages of the deposited film was 57% Pb and 43% Te.

Optical absorption measurements were also performed in order to determine the bandgap energy of the deposited films. Absorption coefficients were determined by using the following relations:

$$T = \frac{(1-r_1)(1-r_2)(1-r_3)\exp(\alpha d)}{1-r_2 r_3 - r_1 \exp(-2\alpha d)(r_2 + r_3 - 2 r_2 r_3)}$$

where $r_1$, $r_2$, $r_3$ are reflection coefficients at the air/film, film/substrate and substrate/air interfaces respectively, α is the optical absorption coefficient of the film, and d is the film thickness. T has been calculated using the following equation:

$$A = -\log_{10} T$$

where A is the absorbance. The absorbance was measured using a Spectrophotometer called UV-Vis Spectrophotometer Perkin-Elmer Lambda 35.

After obtaining the values of absorbance (A) using the spectrophotometer, it is possible to solve the equation and obtain α. The absorption coefficient α is related to the bandgap by the following bandgap semiconductor equation for a direct bandgap semiconductor:

$$\alpha = A(h\gamma - E_g)^2$$

where γ is the frequency of the photon, A is a constant, h is Planck's constant ($6.63 \times 10^{-34}$ J.s) and $E_g$ is the semiconductor bandgap.

Plotting ($\alpha h \, v^{1/2}$ vs. photon energy provided the curves shown in FIGS. 6A-6E. Then, extrapolating the linear portion of the figure at α=0 determines the bandgap of the material. The value h v represents photon energy. Plotting $(\alpha h \, v)^{1/2}$ v. photon energy reveals whether the material is a direct or indirect bandgap material. It also allows for determination of the effectiveness of the light absorption.

Figure 6A:
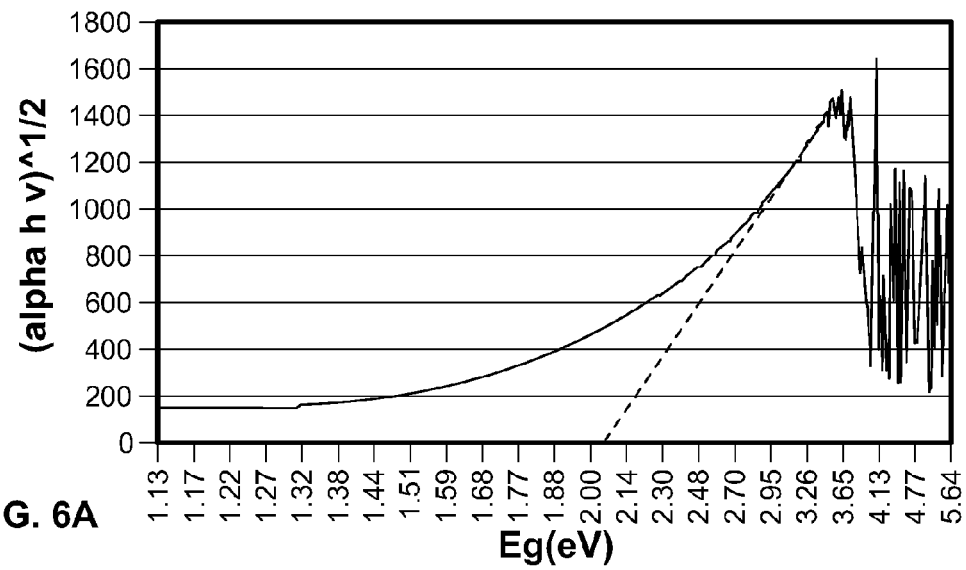
FIGS. 6A-6E are curves illustrating the square root of optical absorption coefficient multiplied by photon energy v. photon energy for various films.

As shown in FIG. 6A, the measured bandgap of the deposited ZnTe film was 2.1 eV, which is very close to the 2.25 eV.

Figure 6B:
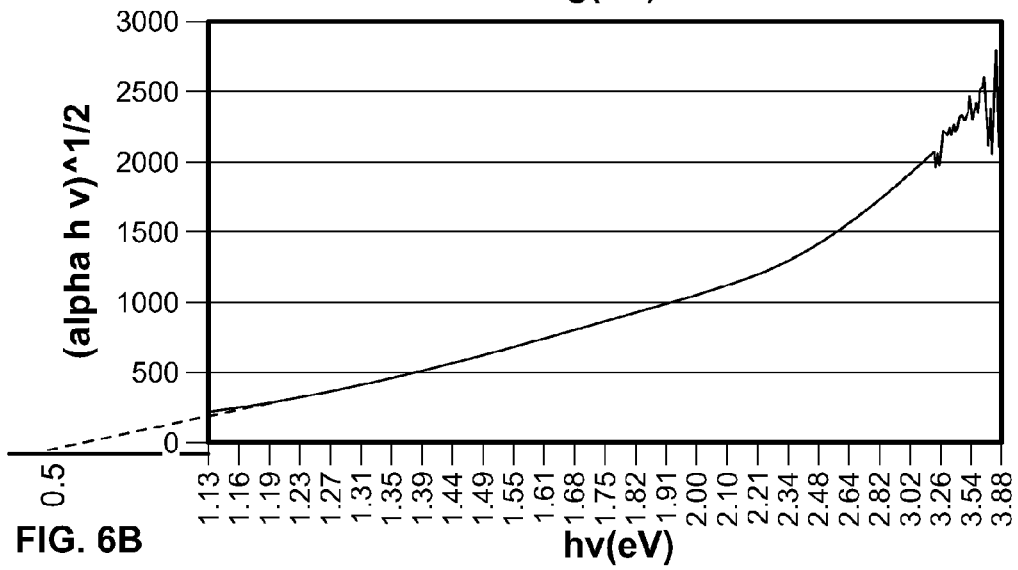

In order to obtain the value of the deposited PbTe film, the curve had to be extrapolated beyond the 1.13 to 3.68 eV region that was provided by the measurements. PbTe has a bandgap of 0.29 eV, which lies in the infrared region. The spectrophotometer did not provide measurements in that region. So in order to get an estimate of the PbTe bandgap, the curve was extrapolated until it intersected the x-axis. The value obtained as the result of extrapolation was 0.5 eV as shown in FIG. 6B.

Figure 6C:
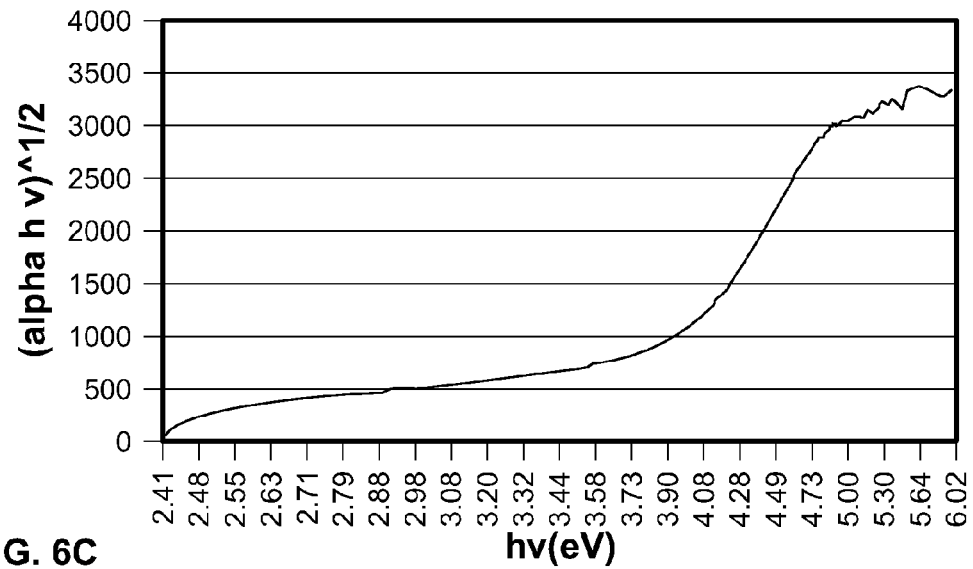

The CdS film had a bandgap of 2.41 eV as shown in FIG. 6C.

Figure 6D:
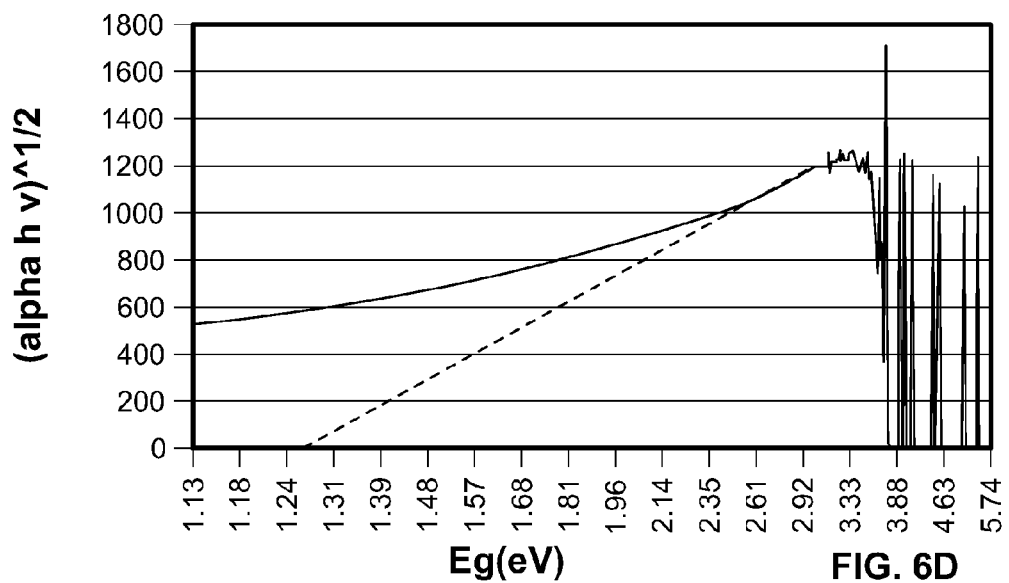
Figure 6E:
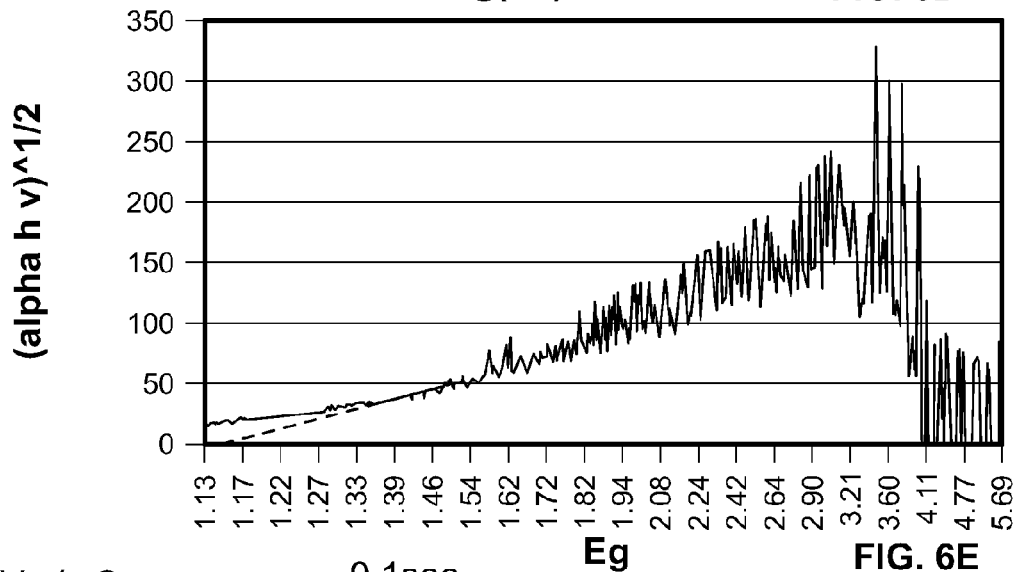

The bandgap of the ZnTe/PbTe composite was 1.26 eV as shown in FIG. 6D and that of the ZnTe/PbTe/ZnTe structure was 1.13 eV as shown in FIG. 6E. Although it seems that there is a shift in the bandgap between the two structures, this shift is not due to the quantum effect, but rather is an average of the bandgap of the two materials. The quantum effect will only be observed if the thickness of the film is in the order of a few nanometers.

Tests were also performed to confirm the conductivity of the films. The thermopower test is an easy technique used to determine the conductivity type of material deposited based on comparing the potential of one known film type to another unknown. It has been shown in the literature that CdS deposits as an n-type material. In order to measure the potential across the as-deposited CdS film a voltmeter was used and a temperature gradient was applied. The temperature gradient was created by heating one terminal of the voltmeter with a soldering iron and placing it on the glass and holding the other terminal on the film. After a few seconds the voltmeter read −6 mV. The same procedure was applied on the ZnTe film. The voltmeter read 2 mV, which indicates that the ZnTe film deposited is p-type. The same technique was also used to determine the conductivity type of the PbTe film. The voltmeter read 4 mV, which indicated that the PbTe film deposited is p-type.

With acceptable parameters and guiding criteria for the electrodeposition of ultrathin thin films of ZnTe and PbTe so determined, a ZnTe/PbTe structure was formed for testing purposes. The first film deposited was zinc telluride followed by a lead telluride film. The deposition procedure is described below.

The procedures described above were used to form a ZnTe/PbTe lattice structure. A ZnTe film was deposited for 5 minutes. On the ZnTe film, a PbTe film was deposited following the same procedure outlined above. The voltage was adjusted to −620 mV relative to the SCE to account for the resistance introduced by the ZnTe film. The deposition time was 5 minutes. A uniform slightly grey film was obtained.

Figure 3:
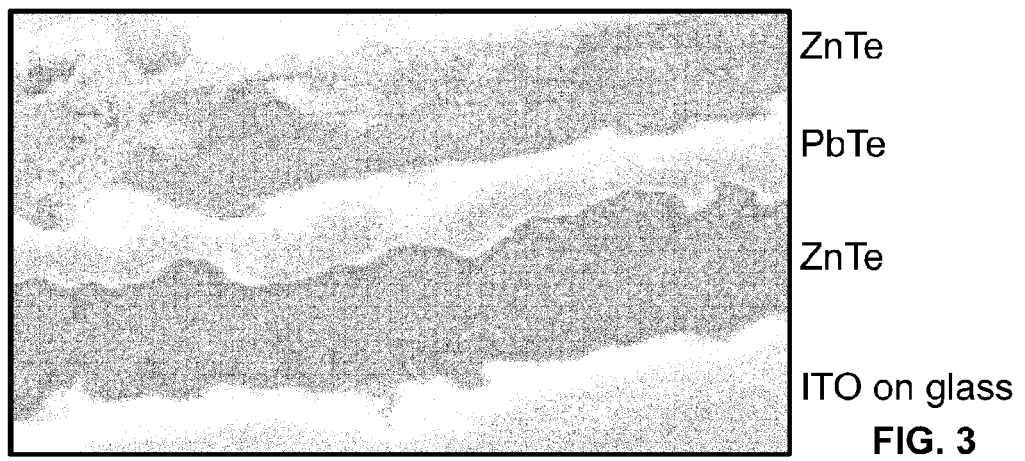
FIG. 3 is a lateral cross-sectional view of an electrodeposited ZnTe/PbTe/ZnTe structure.

The general procedures described above were also used to form a ZnTe/PbTe/ZnTe structure. A ZnTe film was deposited following the procedures outlined above. The pH, temperature and deposition time of the bath were 2.8, 58° C. and 10 minutes respectively. On the ZnTe film, a PbTe film was deposited following the procedure outlined above. The voltage was adjusted to −620 mV vs. a third electrode (a reference saturated calomel electrode (SCE) used in experiments depositing the PbTe film using direct voltage) to account for the resistance introduced by the ZnTe film. The deposition time was 10 minutes. On the PbTe film another ZnTe film was deposited for 20 minutes. The deposition time was increased in these experiments because a uniform three layer structure was not observed under 2-5 minute deposition times. A lateral view of the structure is shown in FIG. 3.

The deposition parameters described above for forming lattice structures having ZnTe and PbTe layers in the 0.2-0.4 μm thickness range were also used to form stacked ZnTe/PbTe structures, testing of which is ongoing. Pulsed, rather than direct voltage, was used in order to obtain thinner films.

Figure 7:
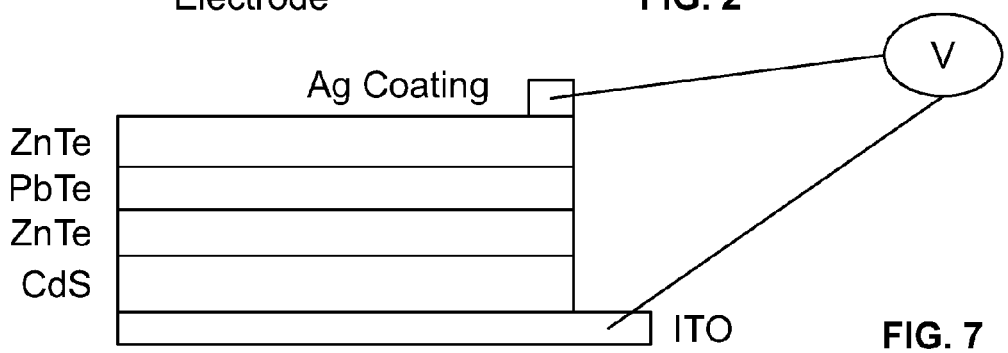
FIG. 7 is a schematic illustration of a fabricated solar cell module for testing purposes.

A solar cell for testing was also fabricated by depositing a layer of CdS on the ITO coated glass as described above. The film showed chemical and optical properties as described above. Then a ZnTe/PbTe/ZnTe structure was deposited on top of the CdS. Finally the layers were covered with silver paint that would act as a contact as shown in FIG. 7. The cell was subjected to a light beam from a light projector and connected to a multi-meter. The multi-meter was connected as an ammeter to the solar cell in order to measure the short circuit current. After about 3 minutes, current of the order of few μA passed through the ammeter. The multi-meter was then connected as a voltmeter to the cell to read the open circuit voltage. The open circuit voltage was 0.05 mV. These results show that the solar cell is working Adjustments of the films compositions and uniformity would lead to a higher output for this basic cell.

As described herein, lead telluride and zinc telluride thin films were deposited electrochemically from aqueous solutions. Cadmium sulfide layers were deposited using chemical bath deposition. The chemical composition of the films was analyzed using scanning electron microscopy (SEM). The optical bandgap was determined by optical absorption spectroscopy. PbTe and ZnTe films were found to have equal stoichiometric proportions of Pb and Te, and of Zn and Te. The chemical composition was analyzed using energy dispersive spectroscopy (EDS). The bandgap of the PbTe and ZnTe were found to be 0.5 and 2.1 eV respectively. The developed films had polycrystalline randomly-oriented structure. The average grain size of the materials was around 100-120 nm in diameter. A lattice structure consisting of ZnTe/PbTe and ZnTe/PbTe/ZnTe were also developed and exhibited bandgaps of 1.26 eV and 1.13 eV, respectively. A working solar cell was also developed from the deposited thin films. Modifications to the film thicknesses of PbTe and ZnTe layers can be used to change the bandgap of the structure to customize individual P-N junctions in a multi-junction solar cell structure to provide for efficient conversion of an incident spectrum to electrical energy.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A multi-junction solar cell comprising:
  a glass substrate coated with a conductive layer;
  a multi-cell tandem solar cell comprising a plurality of P-N junctions electrically connected to each other in series, each P-N junction including (i) a P-type absorber layer including a periodic array of alternating layers of first and second semiconductor materials electrodeposited over the glass substrate and (ii) a N-type emitter layer, wherein the first and second semiconductor materials have different bandgaps when provided in bulk thickness, wherein the alternating layers are provided in thicknesses less than bulk thickness and sufficiently thin such that the effective bandgap of the absorber layer is between the bandgaps of the materials when provided in bulk thickness,
  wherein the effective bandgap of at least one of the absorber layers is different from that of at least one other absorber layer,
  wherein the layers are alternating layers of II-VI and IV-VI compounds; and
  electrical contacts for passing current out of said solar cell upon irradiation thereof with radiation which produces a potential across at least one of said P-N junctions.

2. The multi-junction solar cell of claim 1, wherein the alternating layers comprise a plurality of alternating layers of zinc telluride and lead telluride.

3. The multi-junction solar cell of claim 1, wherein the absorber layer is not a compositional superlattice.

4. The multi-junction solar cell of claim 1, wherein the N-type emitter layer is a layer of cadmium sulfide.

5. The multi-junction solar cell of claim 1, wherein the conductive layer comprises a layer of indium tin oxide.

6. The multi-junction solar cell of claim 1, further comprising an interconnect layer disposed between and electrically connecting the P-N junctions together.

7. The multi-junction solar cell of claim 6, wherein the interconnect layer comprises a plurality of conductive islands.

8. The multi-junction solar cell of claim 1, wherein the conductive islands comprise mercury telluride or copper telluride islands.

9. The multi-junction solar cell of claim 1, wherein the effective bandgap of the absorber layer of a first one the plurality of P-N junctions is about 1.0 eV and the effective bandgap of the absorber layer of a second one of the plurality of P-N junctions is about 1.8 eV.

10. The multi-junction solar cell of claim 1, wherein the effective bandgap of the absorber layer of a first one the plurality of P-N junctions is about 0.8 eV, the effective bandgap of the absorber layer of a second one of the plurality of P-N junctions is about 1.4 eV, and the effective bandgap of the absorber layer of a third one of the plurality of P-N junctions is about 2.3 eV.

11. The multi-junction solar cell of claim 1, wherein the alternating layers of the absorber layer are thin film layers and form a compositional superlattice.

12. The multi-junction solar cell of claim 11, wherein each compositional superlattice includes between 30-40 alternating layers of the II-VI and IV-VI compounds.

13. The multi-junction solar cell of claim 12, wherein each compositional superlattice has an effective absorption thickness of between about 1 to about 5 μm and each of the alternating layers of II-VI and IV-VI compounds has a thickness between about 100 to about 1000 Å.

14. The multi-junction solar cell of claim 1, wherein the effective bandgap of each absorber layer is dependent on the thicknesses of the alternating layers of II-VI and IV-VI compounds in the respective P-N junction.

15. The multi-junction solar cell of claim 1, wherein the effective bandgap of at least one of absorber layers is selected to capture wavelengths of incident light of about 0.5 μm.

16. The multi-junction solar cell of claim 1, wherein the effective bandgap of at least one of the absorber layers is selected to capture wavelengths of incident light of about 4.0 μm.

17. The multi-junction solar cell of claim 1, wherein the alternating layers comprise a plurality of alternating layers of a II-VI compound and lead telluride.

18. The multi-junction solar cell of claim 17, wherein the II-VI compound is a II-Te compound.

19. The multi-junction solar cell of claim 1, wherein the N-type emitter layer is a layer of cadmium sulfide and the conductive layer comprises a layer of indium tin oxide.

20. A method of generating electricity, the method comprising exposing the multi-junction solar cell of claim 1 to solar radiation.

* * * * *

UNITED STATES PATENT AND TRADEMARK OFFICE
CERTIFICATE OF CORRECTION

PATENT NO. : 8,835,752 B2  
APPLICATION NO. : 12/991578  
DATED : September 16, 2014  
INVENTOR(S) : Pritpal Singh Page 1 of 1

It is certified that error appears in the above-identified patent and that said Letters Patent is hereby corrected as shown below:

IN THE CLAIMS:

Column 16, line 1, delete "1" and insert therefor --7--

Signed and Sealed this
Thirteenth Day of January, 2015

Michelle K. Lee
*Deputy Director of the United States Patent and Trademark Office*